US010514408B2

(12) United States Patent
Revel et al.

(10) Patent No.: US 10,514,408 B2
(45) Date of Patent: Dec. 24, 2019

(54) METHOD AND ASSEMBLY FOR LOCATING ELECTROSTATIC DISCHARGES ON AIRCRAFT IN FLIGHT

(71) Applicant: AIRBUS SAS, Blagnac (FR)

(72) Inventors: Ivan Revel, Ramonville (FR); Gilles Peres, Toulouse (FR)

(73) Assignee: AIRBUS SAS, Blagnac (FR)

( * ) Notice: Subject to any disclaimer, the term of this patent is extended or adjusted under 35 U.S.C. 154(b) by 258 days.

(21) Appl. No.: 15/531,895

(22) PCT Filed: Nov. 30, 2015

(86) PCT No.: PCT/EP2015/078074
§ 371 (c)(1),
(2) Date: May 31, 2017

(87) PCT Pub. No.: WO2016/087378
PCT Pub. Date: Jun. 9, 2016

(65) Prior Publication Data
US 2017/0261539 A1    Sep. 14, 2017

(30) Foreign Application Priority Data
Dec. 1, 2014  (FR) ...................................... 14 61707

(51) Int. Cl.
*G01R 31/00* (2006.01)

(52) U.S. Cl.
CPC ......... *G01R 31/001* (2013.01); *G01R 31/008* (2013.01)

(58) Field of Classification Search
CPC .... G01R 31/008; G01R 31/001; G01R 29/24; G01R 29/0814; G01S 5/0009; G01S 5/06
See application file for complete search history.

(56) References Cited

U.S. PATENT DOCUMENTS

| H000536 H | 10/1988 | Strickland et al. | |
|---|---|---|---|
| 5,111,402 A * | 5/1992 | Brooks ................ | G01R 31/008 324/73.1 |
| 5,923,160 A | 7/1999 | Dechiaro et al. | |
| 6,064,340 A * | 5/2000 | Croft ..................... | G01S 5/0009 324/72.5 |

(Continued)

OTHER PUBLICATIONS

International Search Report, International Application No. PCT/EP2015/078074, dated Feb. 8, 2016.

(Continued)

*Primary Examiner* — Douglas X Rodriguez
*Assistant Examiner* — Brent J Andrews
(74) *Attorney, Agent, or Firm* — Greer, Burns & Crain, Ltd.

(57) ABSTRACT

A method for locating electrostatic discharges occurring on an aircraft in flight including a step of recording, during the flight of the aircraft, electromagnetic signals resulting in the electrostatic discharges and received by a plurality of detectors arranged at different places on an exterior surface of the aircraft, a step of analyzing the signals recorded during the flight, each of the signals, received by the various detectors and corresponding to one and the same electrostatic discharge, are processed to identify at least one zone of an exterior surface of the aircraft, determining a structural part in which the electrostatic discharge probably occurred.

18 Claims, 6 Drawing Sheets

(56) References Cited

U.S. PATENT DOCUMENTS

| | | | | |
|---|---|---|---|---|
| 8,410,784 B1* | 4/2013 | Brown | ............... | G01R 29/24 |
| | | | | 324/457 |
| 8,723,694 B1* | 5/2014 | Finley | ............... | B64D 45/00 |
| | | | | 340/601 |
| 2003/0071628 A1* | 4/2003 | Zank | ............... | G01D 9/005 |
| | | | | 324/457 |
| 2008/0246490 A1* | 10/2008 | Brown | ............... | G01N 15/0656 |
| | | | | 324/457 |
| 2012/0326889 A1* | 12/2012 | Kabler | ............... | G01S 7/022 |
| | | | | 340/905 |
| 2013/0193978 A1* | 8/2013 | Woolley | ............... | G01N 15/0637 |
| | | | | 324/457 |

OTHER PUBLICATIONS

Cierva et al., (Aug. 31, 1965), "Theoretical Analysis of Aircraft Electrostatic Discharge Final Report" Dynasciences Corp. http://www.dtic.mil/dtic/tr/fulltext/u2/621521.pdf.

\* cited by examiner

METHOD AND ASSEMBLY FOR LOCATING ELECTROSTATIC DISCHARGES ON AIRCRAFT IN FLIGHT

CROSS-REFERENCE TO RELATED APPLICATIONS

This application is the National Stage of International Application No. PCT/EP2015/078074, having an International Filing Date of 30 Nov. 2015, which designated the United States of America, and which International Application was published under PCT Article 21(2) as WO Publication No. 2016/087378 A1, and which claims priority from, and the benefit of, French Application No. 1461707, filed on 1 Dec. 2014, the disclosures of which are incorporated herein by reference in their entireties.

BACKGROUND

1. Field

The field of the presently disclosed embodiment is that of aircraft and electrostatic discharge phenomena that occur on aircraft in flight. The disclosed embodiment more particularly concerns a method and a device for detecting and locating the location on the structure of an aircraft in flight where an electrostatic discharge has occurred.

2. Brief Description of Related Developments

It is well known that the friction of particles present in the air on the structure of an aircraft in some circumstances causes accumulation of electrical charges.

If the accumulated charges become sufficient for the electric field locally to exceed the breakdown threshold an electrostatic discharge occurs.

On the scale of an aircraft these discharges generally remain of low intensity and are without danger for the structure, but they nevertheless produce sufficiently intense electromagnetic radiation to interfere with the operation of some equipment of the aircraft, in particular radio equipment.

This phenomenon was historically observed and studied in detail in the 1960's at a time when the structures of airliners were essentially made of metal.

It led to the development of static dischargers that continuously disperse into the air electrical charges tending to accumulate on the structure in flight.

This solution proved satisfactory as long as aircraft structures were mainly made of metal and electrically conductive.

However, the problems linked to electrostatic discharges have reappeared in a critical manner with the progressive introduction into aircraft structures of composite materials that are insulative or weakly conductive.

In the case of these insulative or weakly conductive materials, surface metallization and electrical continuity braids have been used so that the charges can flow and in the end be dispersed by the known devices.

However, on modern aircraft including numerous composite material structural elements it is found that electrostatic discharges are more and more frequent.

If these discharges become a disturbance for aircraft systems, it is necessary to look for their origin, generally a localized defect of metallization or of electrical continuity of the structure, to eliminate its source.

A search of this kind proves laborious because there is generally no visible indication of a location where an electrical discharge the effects of which have been reported by a crew may have occurred. This results in a blind search that leads to lengthy immobilization of the aircraft concerned and leads to corrective measures being applied with no certainty that they are relevant and that often do not provide the solution to the problem encountered.

SUMMARY

The presently disclosed embodiment provides a solution to this problem in giving a maintenance operator the means for locating the location on an aircraft structure of an electrostatic discharge with sufficient accuracy to enable them to carry out a rapid investigation of the phenomenon and identification of its causes.

The disclosed embodiment concerns a method of locating electrostatic discharges that have occurred on an aircraft in flight, characterized in that it includes: a step during the flight of the aircraft of recording electromagnetic signals stemming from said electrostatic discharges and received by a plurality of detectors Di arranged at various locations on an exterior surface of said aircraft;

a step of analyzing the signals recorded during the flight, in which analysis step characteristics of each of the signals received by the various detectors and corresponding to the same electrostatic discharge are processed to identify at least one zone of an exterior surface of the aircraft determining a structure part in which the electrostatic discharge probably occurred.

The method therefore enables a maintenance operator to locate a smaller investigation zone, limiting the number of hypotheses that have to be envisaged in the case of a search in non-circumscribed zones of the aircraft, which enables a significant saving in terms of how long the aircraft is immobilized for treating the problem encountered, using the method of the disclosed embodiment making it possible to reduce this immobilization from several days to a few hours. Thanks to this method, it is also certain that the maintenance operators can rapidly apply the appropriate corrective measures, whereas in the absence of a limited location of the electrostatic discharge zone they would in most cases have to carry out repairs with no certainty of applying them to the appropriate place.

In one aspect of the method, the recording step includes a step of sampling the signals received by each detector Di and time-stamping said signals relative to a timebase common to all of the detectors.

Once conditioned in this way the stored signals are ready to be exploited in a subsequent digital processing subsystem.

In one aspect of the disclosed embodiment, the sampled and time-stamped signals are recorded in a permanent memory of a recording system onboard the aircraft.

The signals are then available for off-line processing and this avoids using relatively powerful real time processing means that would have to be onboard the aircraft.

The analysis step advantageously includes a substep of grouping the recordings from the detectors Di event by event, an event corresponding to an electrostatic discharge during the flight of the aircraft.

Each event corresponding to an electrostatic discharge can therefore be processed individually and this avoids the risk of confusing different nearby events when processing the signals.

According to one aspect of the method, the analysis step applies to the recordings from the detectors corresponding to the same event inverse electromagnetic wave propagation algorithms to determine the zone on the exterior surface of the aircraft where the electrostatic discharge from which said electromagnetic waves stem probably occurred.

A zone localizing the electrostatic discharge is therefore determined taking into account a model of this aircraft structure without employing any upstream simulation in the method.

According to another aspect of the method, the analysis step compares data from the recordings corresponding to the same event with data simulated by direct electromagnetic wave propagation algorithms applied to electromagnetic emission sources at chosen locations on the structure of the aircraft in order to determine by a process of comparison the zone on the exterior surface of the aircraft where the electrostatic discharge from which said electromagnetic signals stem probably occurred.

Although employing intermediate calculations, even an iterative process, this aspect has the advantage of using direct propagation simulations for which the known algorithms are faster and give better results.

In one aspect of the disclosed embodiment, the characteristics of the recordings from the detectors Di corresponding to the same event are compared to the measured or calculated effects of an electromagnetic wave emitted by each of the points of a meshing of the exterior surface of the structure of the aircraft and in which the zone is defined by a subset of the points of the meshing with characteristics closest to the characteristics of the measured signal.

In this aspect, the simulation calculations, which are relatively time-consuming in practice, are effected only once for each type of aircraft and the identification of a point or a limited number of points for localizing the event is effected by comparison and by simple calculations yielding rapid results.

One aspect of the disclosed embodiment employs a preliminary step of creating a reference database in which reference database the characteristics of the signals received by each of the detectors Di are defined for each of the points of the meshing considered as an emission source of an electromagnetic wave.

The reference database is advantageously used during the analysis step to identify rapidly the points of the meshing whose simulated effects on the detectors are the closest to those stored for an event.

The advantages of a solution of this kind are obvious considering that, with ordinary calculation means, the construction of the reference database necessitates approximately six days and the location of the points for determining the searched zone is practically instantaneous, at most a few minutes depending on the characteristics of the meshing.

According to one aspect of the method the method advantageously includes a step of identification in graphical or digital form of the zone on the exterior surface of the aircraft.

Thus an operator identifies rapidly on the aircraft a zone that they must inspect.

The disclosed embodiment also concerns an assembly using the method to locate on an aircraft structure at least one electrostatic discharge occurring in flight, said assembly including:
  at least one recording system onboard the aircraft, said recording system including:
    a plurality of detectors Di intended to be arranged at different locations on an exterior surface of the structure of the aircraft;
    means for sampling electromagnetic signals received by each detector of the plurality of detectors;
    means for time-stamping said electromagnetic signals received; and
    means for permanently storing the sampled and time-stamped signals received by each of the detectors Di;
  at least one analysis system including means for processing the signals recorded by the recording system, in which processing means:
    the signals coming from the various detectors are compared with one another to identify in said recorded signals at least one event corresponding to an electrostatic discharge; and
    one or more digital electromagnetic waves propagation models are used to determine a zone of the exterior surface of the structure of the aircraft in which said electrostatic discharge that has been identified probably occurred.

In one aspect of the disclosed embodiment, the recording system includes hardware or software means for synchronization of the time-stamps allocated to the signals received by the detectors, said synchronization means compensating differences of transmission time of the signals between the detectors and the recording means. Thus at the time of recording the events account is taken of the transmission times of the signals between the detectors and the recording means corresponding to those of the aircraft on which the recording is carried out and this avoids correcting these transmission times at the level of the analysis system that would otherwise have to take into account differences between aircraft of the same type.

In one advantageous aspect of the disclosed embodiment, at least one detector employs a radio antenna of the aircraft to which is added an antenna coupler connected on the one hand to an antenna cable intended for an equipment of the aircraft, for which said antenna is installed, and on the other hand to a transmission medium connected to the recording means.

This avoids installing dedicated detectors, or at least limits the number of these, and the technical and economic consequences for the structure and the design of the aircraft of the installation of new detectors.

If a number and an arrangement of the existing antennas of the aircraft are suited to the requirements of the recording system, it is advantageously not necessary to install any additional detectors.

In one aspect of the disclosed embodiment, the recording system includes digital connection means for transfer of data with an installation on the ground to transfer the data recorded by said recording system to the analysis system.

The transfer of data to a workshop for analyzing the stored data can therefore be carried out without intervention on the aircraft.

In one aspect of the disclosed embodiment, the signal processing means of the analysis system include a simulator incorporating inverse electromagnetic wave propagation algorithms and apply said inverse propagation algorithms to the signals received by the detectors Di and corresponding to the same event to locate a zone on the exterior surface of the structure of the aircraft from which stem said signals emitted by an electrostatic discharge.

In another aspect of the disclosed embodiment, the signal processing means include a simulator incorporating direct electromagnetic wave propagation algorithms and applies said algorithms to determine, by comparison of the recorded data corresponding to the signals received by the detectors Di and corresponding to the same event with simulated data, a zone on the exterior surface of the structure of the aircraft from which stem the signals emitted by an electrostatic discharge.

In one aspect of the disclosed embodiment, the assembly includes a first system for construction of a reference database, said first system including a digital model of the structure of the aircraft on an exterior surface of which aircraft is defined a meshing determining arbitrary origins of electromagnetic waves, said first system including a simulator incorporating the direct electromagnetic wave propagation algorithms, the reference database including for each origin Op defined by the meshing at least one item of information on the position of said origin on the exterior surface of the structure of the aircraft and calculated characteristics of time or of shape of each of the signals received by each of the detectors Di following a simulated emission of an electromagnetic wave at the location of said origin.

According to a principal application of the disclosed embodiment, the system as described above further includes an aircraft in which is installed the system for recording the electromagnetic signals emitted by electrostatic discharges on said aircraft.

Radio communication and/or radio navigation receive antennas of the aircraft are advantageously also used as detectors Di of the storage system.

BRIEF DESCRIPTION OF THE DRAWINGS

The detailed description of a method and of aspects of the disclosed embodiment are given with reference to the figures, which show diagrammatically.

DETAILED DESCRIPTION

In the figures, similar elements are identified by identical references.

In the various views preference has been given to the illustrative side of the method and of the system implementing the method and the various elements represented are not to scale.

The phenomena whereby electrical charges accumulate on parts of an aircraft and establish between different parts of the structure potential differences or local reinforcements of the electric field causing electrostatic discharges are well known and will not be described in detail here.

The charges appear on the exterior of the aircraft, under certain flight conditions, by virtue of the triboelectric effect of the friction of particles present in the air on the structure of the aircraft, and accumulate in zones, when they are not evacuated naturally, until the potential differences of the differently charged parts are sufficient to produce an electrostatic discharge.

Electrostatic discharges can also occur in zones of the aircraft where electrical charges accumulate naturally, in particular the conductive extremities of said aircraft in which the electric field is locally reinforced. In these zones, especially if they are not provided with static dischargers, the local electric field can exceed a breakdown value.

In accordance with known techniques, the phenomena of electrostatic discharge in flight are prevented by making the structure of the aircraft equipotential and by evacuating electrostatic charges into the atmosphere as soon as possible to limit the potential differences and to avoid the intense electromagnetic emissions that discharges produce in the case of high potential differences or high electrical charges. The electrostatic charges are generally evacuated into the air by static dischargers fixed to the structure of the aircraft in zones where the electrical charges tend naturally to accumulate, in particular the ends of the wings or other lift surfaces, because of the sharp edge effect.

A modern aircraft can include thousands of structural parts assembled together and the electrical continuity between all those parts, despite the precautions taken, is not always guaranteed from the entry of the aircraft into service to the end of its service life.

The precautions taken are most often metal-metal assemblies by means of electrically conducting fasteners, articulated connections duplicated by metallization braids, parts that are not intrinsically conductive covered with conductive layers, for example metal meshes in composite materials.

However, the presence of surface protection on parts and oxidation of some stripped surfaces lead to the occurrence of equipotential connection faults that are difficult and time-consuming to identify on an assembled aircraft structure.

The objective of the presently disclosed embodiment is not to identify the type of fault that can lead to an electrostatic discharge or to define a solution for remedying the occurrence of discharges, but rather to localize the location of an electrostatic discharge experienced in flight from its effects so that a maintenance operator on the ground can search for defects in a smaller zone to identify the fault at the origin of the discharge observed with very high probability and therefore apply effective corrective measures for remedying the fault, which is generally an electrical continuity fault.

The disclosed embodiment locates at least one electrostatic discharge on the structure of an aircraft.

Figure 1:
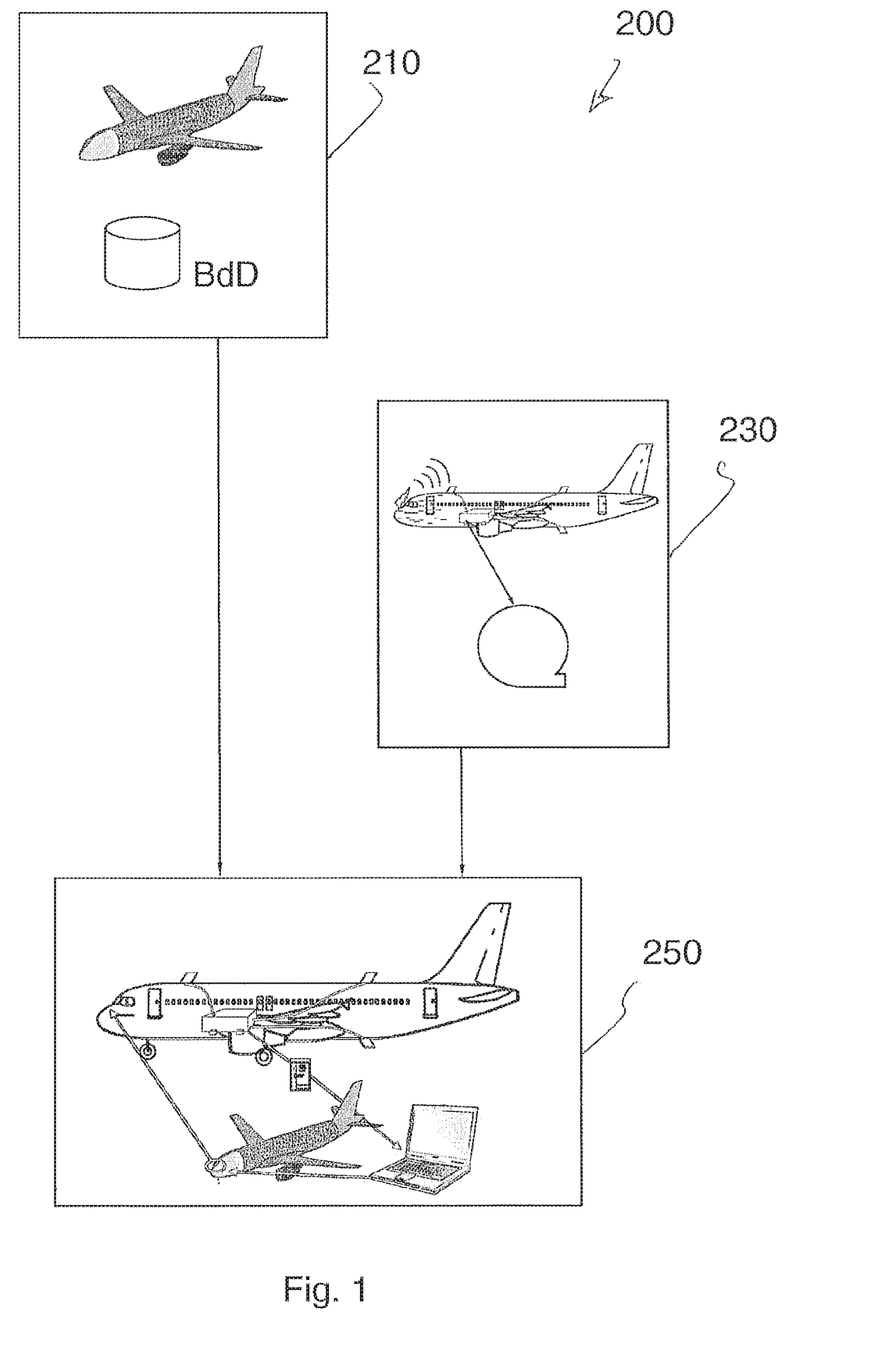
FIG. 1 shows an overview of the method according to one aspect of the disclosed embodiment employing three principal steps.

The method 200, as shown diagrammatically in the FIG. 1 block diagram, includes at least three steps:
1. A preliminary step 210 of characterization of the aircraft;
2. A step 230 of recording in flight the effects of one or more electrostatic discharges on detectors arranged on the structure of the aircraft;
3. A step 250 of analysis of the recordings and of processing of said recordings so as to obtain a probable zone containing the location of each discharge recorded.

Figure 5:
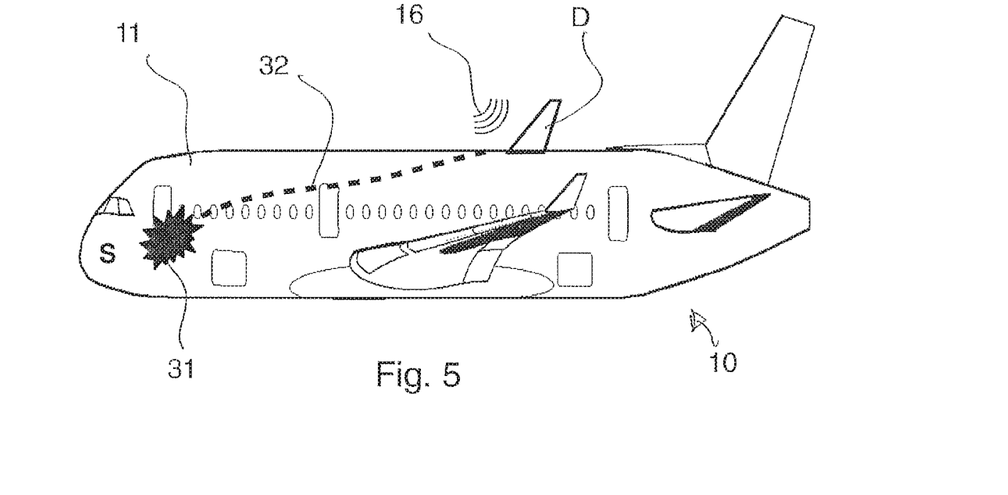
FIG. 5 shows an illustration of the effects on an aircraft of an electrostatic discharge.

The method utilizes the physical phenomenon, illustrated in FIG. 5, whereby an electromagnetic signal 13 resulting in this case from an electrostatic discharge 31 is propagated in a given environment, here an aircraft 10, from a source S of said disturbance to a detector D, in a substantially constant manner.

As a result of this the paths 32 taken, the propagation times and the transformations (in particular the attenuations) of the electromagnetic signals between the source S and the detector D are reproducible and predictable.

This constancy is a direct outcome of the Maxwell equations that model the propagation of electromagnetic waves and because the propagation environment, in particular a structure 11 of the aircraft 10 concerned, is unchanged.

Figure 6A:
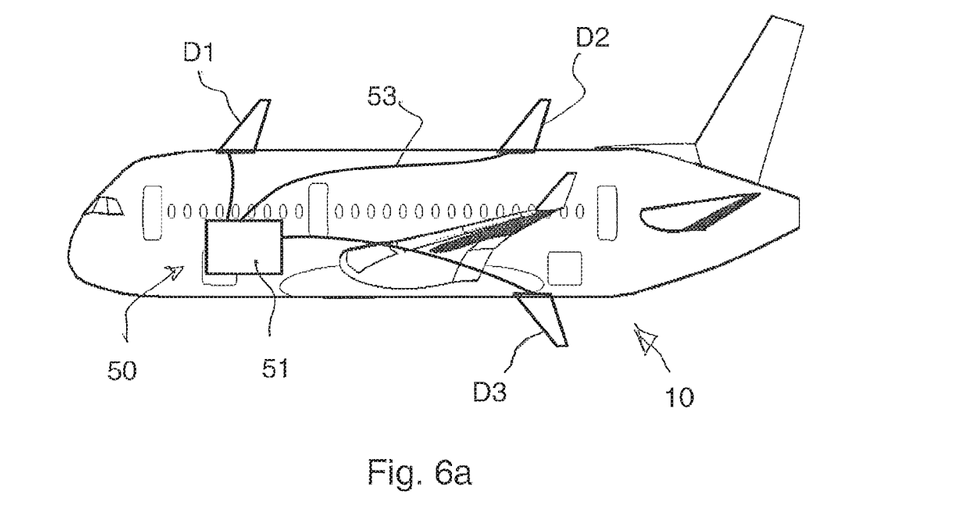
FIG. 6a shows an aircraft carrying a system for recording signals stemming from electrostatic discharges.

To locate on the structure 11 of an aircraft 10 the location where an electrostatic discharge has occurred, there is used, as shown in the FIG. 6a theoretical diagram, a plurality of detectors Di distributed across the structure of the aircraft, the index i varying from 1 up to the number N of detectors used.

Each detector Di is designed to detect the electromagnetic fields reaching it in the range of expected frequencies and energies of the electrostatic discharges to be located.

It must be understood here that the electromagnetic fields in question are those with intensities sufficient to disturb wanted signals received by an aircraft but in practice of much lower intensity than those resulting from other violent phenomena such as lightning strikes on the structure.

Figure 2:
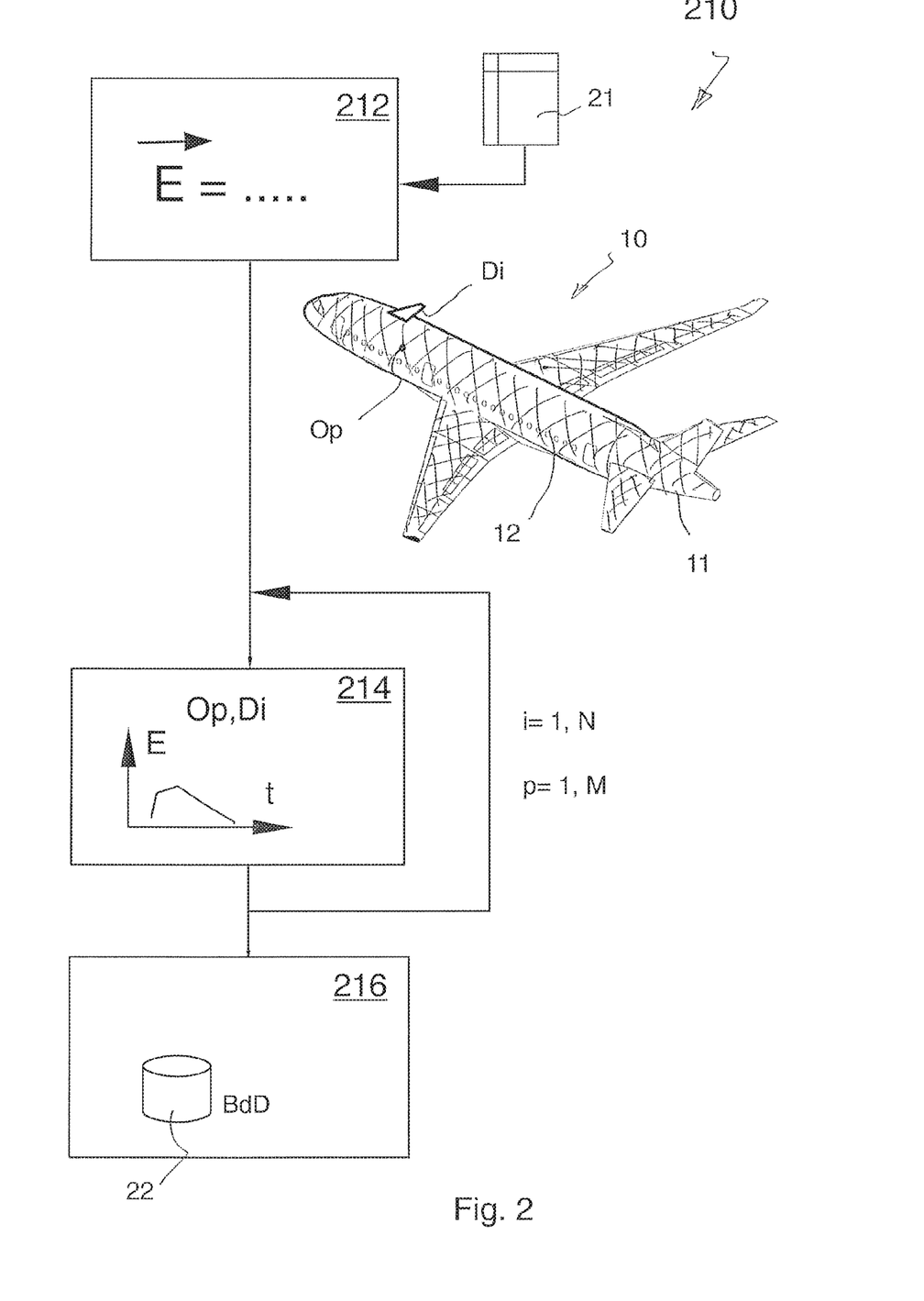
FIG. 2 shows the first step of the method from FIG. 1 for the creation of a reference database.

In the preliminary step 210 of characterization of the aircraft, illustrated in the FIG. 2 diagram, a reference database 22 is constructed the content of which is established by signals received by each of the detectors Di for a plurality of electromagnetic emissions localized at different origins Op determined on the structure 11 of the aircraft, the index p representing a rank of a given origin.

The origins Op are chosen to form 212 a meshing 12 of an exterior surface of the aircraft with a chosen pitch that in practice determines a resolution of the method of locating an electrostatic discharge.

The number of origins Op can be large, p potentially reaching a number M that can exceed several thousand, in practice from 1000 to more than 5000 depending on the dimensions of the aircraft concerned, the method being, at least in theory, all the more accurate the tighter the meshing, as will become clear hereinafter.

Considering an electrostatic discharge at a known origin Op of the meshing, p being in the range [1, M], said electrostatic discharge produces at each detector Di a signal characteristic of said discharge and characteristic of said origin.

One aspect of the method considers at 214 the signal corresponding to the electric field E as a function of time t.

To be more specific the reference database 22 will take into account a temporal offset between the signals 13 received by the various detectors for the same electromagnetic emission.

The reference database 22 therefore includes, when it is constituted, a table of origins Op, p ranging from 1 to M, in which there are defined for each origin:
  a position of the origin Op on the structure 11 of the aircraft;
  for each detector Di, i=1 to N, a shape of the electromagnetic field received as a function of time on a timescale common to all the detectors.

The position of an origin Op of the meshing 12 is identified in the database 22 by any means, preferably in digital form, enabling said location on the structure 11 of the aircraft to be located, for example a system of coordinates or a system of zone codes.

The shape of the electromagnetic signal simulated at an origin Op is advantageously normalized in terms of its intensity and profile as a function of time for the requirements of the method and is identical for all the origins Op.

This preliminary step 210 of creation of the database is in principle carried out only once for the execution of the method and the reference database 22 will in principle be the same for the application of the method 200 of the disclosed embodiment to all aircraft of the same design.

In fact, although there may be differences of detail, for example because of manufacturing dispersions, in the structures of two aircraft of the same design, these differences are a priori minimal and relatively unlikely to change the content of the database to the point of affecting the accuracy of location according to the method beyond what is expected.

Although this preliminary characterization step 210 can be carried out by trial and error, it will be preferable to produce the database 22 by calculation from a digital model 21 of the structure of the aircraft and using algorithms for solving the Maxwell equations.

In fact modern digital calculation means enable satisfactory simulation with relatively accurate results of the characteristics at a given point of an electromagnetic field having a remote emission source as its origin.

A contrario, trial and error measurements for a grid of several thousand points would be particularly laborious and would require test protocols that would not necessarily lead to a better accuracy than I obtained by calculation, but would undoubtedly be much more costly.

Figure 3:
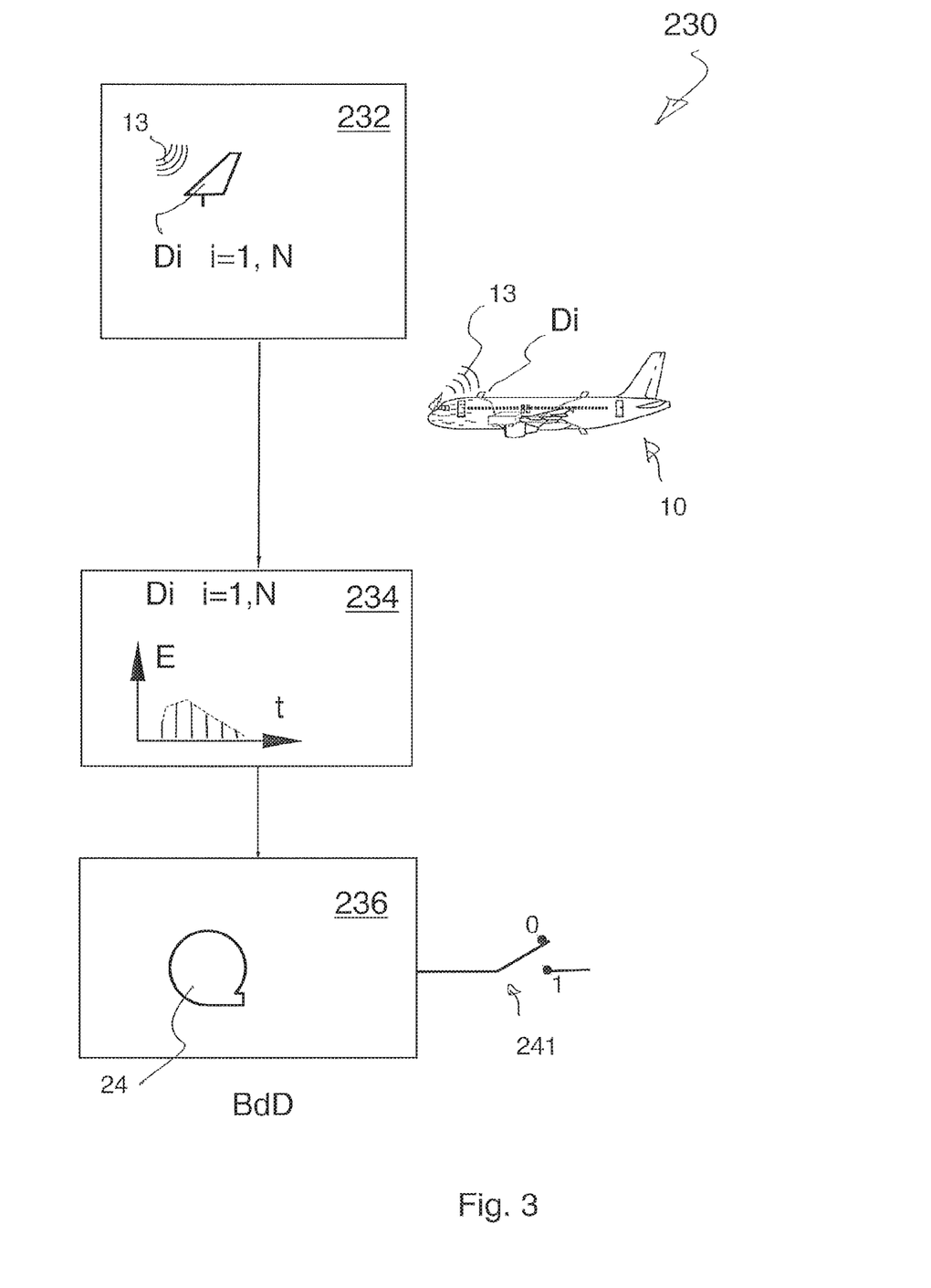
FIG. 3 shows the second step of the method during which the data relating to electrostatic discharges is recorded during the flight of the aircraft.

In the recording step 230 shown in the FIG. 3 diagram the radio signals 13 received 232 by the various detectors Di are recorded.

According to various operating modes, a recording 24 can be put into service 241 automatically and continuously when the aircraft is in flight or commanded by a crew if they notice an abnormal level of radio interference to the systems of the aircraft 10. In practice these two modes are compatible and can correspond to different situations.

For example in an ordinary flight of the aircraft an automatic recording mode avoids adding to the crew's workload. A contrario, under investigative conditions during a test flight or during the development of an aircraft, recording may be controlled and correlated with other observed events.

It is equally possible to perform continuous recording in flight, the recordings being automatically analyzed during the flight so as to discard periods other than those during which levels of electromagnetic activity sufficient to correspond to a risk of disturbance are observed.

During this recording step 230, the signals 13 received by each detector Di are sampled 234, digitized and memorized 236, being synchronized relative to an absolute timebase.

By synchronization is meant that each signal received by a detector is time-stamped when it is received by said detector.

Figure 4:
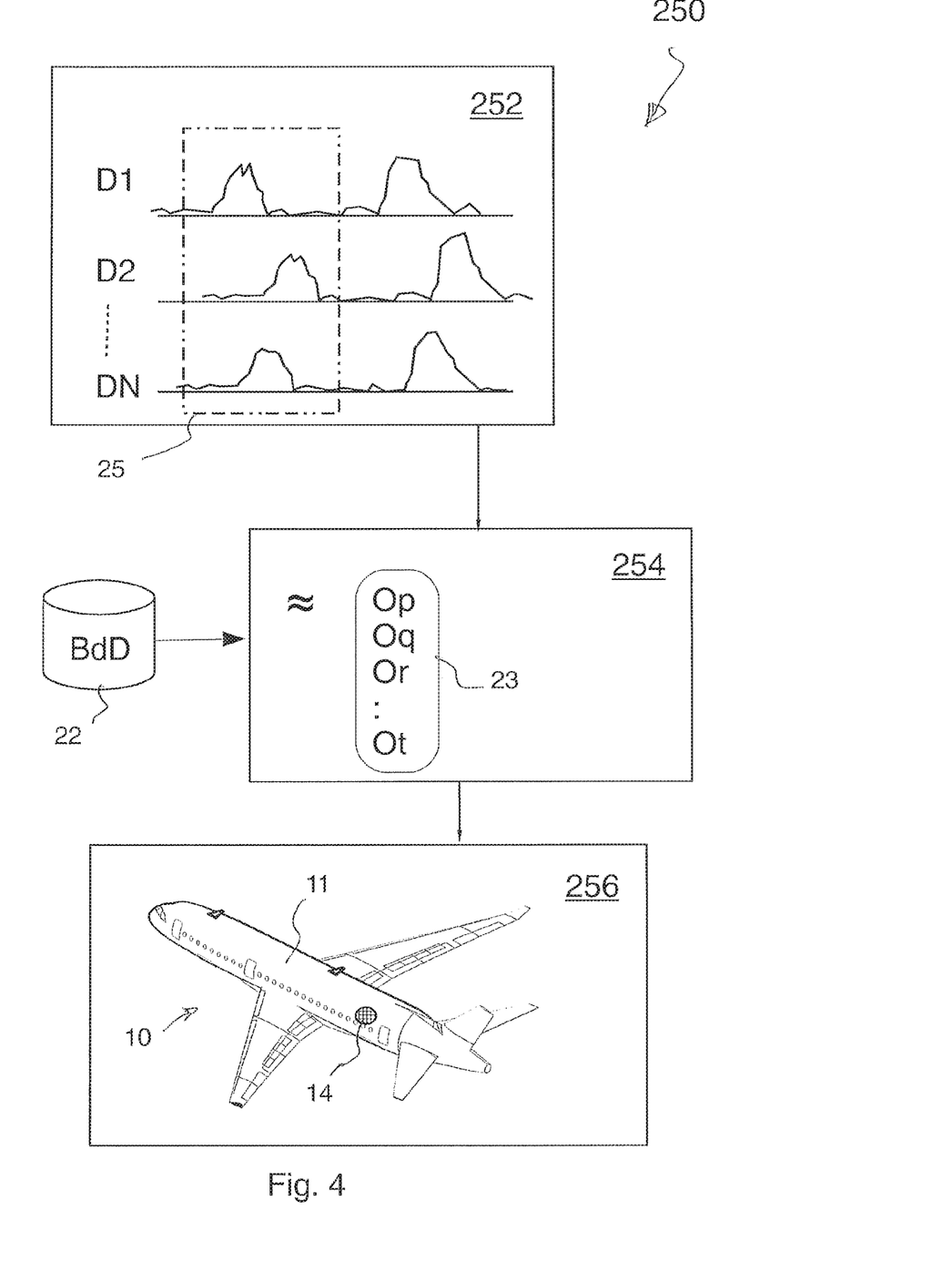
FIG. 4 shows the third step of the method from FIG. 1 leading, through the processing of the data recorded during the second step, to the location on the structure of the aircraft of the location of the electrostatic discharge.

When electrostatic discharge events have been reported by a crew or are merely being looked for, the recordings 24 are analyzed during an analysis step 250 shown in the FIG. 4 diagram.

In a first regrouping substep 252, the recordings 24 from the various detectors Di are grouped according to the events 25, i.e. for the same electrostatic discharge 31 generating an electromagnetic signal 13.

Thus there is obtained for each event 25 a series of N elementary recordings, N corresponding to the number of detectors, as shown by the dashed line frame in FIG. 4 in step 252 of the method.

The recordings of the signals from two detectors corresponding to the same event 25 are identified by:
- a time interval separating the time-stamps of the signals detected in two recordings which, given the dimensions of the aircraft and the position of the detectors, are necessarily contained in a limited time window for the same event, and this makes it possible to exclude from an event signals recorded outside said time window;
- if necessary, shapes and/or intensities of the recorded signals that correspond to an electrostatic discharge signature and can be identified in the various recordings of the same event.

These various identification methods, or other methods of processing the signal, may each be sufficient to group the events, in particular with low levels of disturbance. They can equally be combined for better correlation of the recordings, in particular in an environment with high levels of disturbance.

The recordings of the signals received by the various detectors and identified as corresponding to the same event 25 are then compared to one another to assign the event that gave rise to them attributes of the same kind as those attributed in the reference database 22 to each of the origins Op of the meshing 12.

In a comparison substep 254, following on in the method from the regrouping substep 252, the attributes identified for the recorded event 25 concerned are compared to the attributes of each of the origins Op from the reference database 22 so as to identify in a substep 23 of origins with attributes that are the closest to those of the recorded event concerned.

The number of origins of the subset is not imposed but is advantageously of the order of at least 3.

To illustrate one aspect of this analysis step 250 of the method, consider a method that uses four detectors D1, D2, D3 and D4 and takes into account the time at which the electromagnetic signals are received by each detector, i.e. the time-stamp.

For the same event 25 identified during the grouping substep 252 there are therefore established time differences dt at which the electromagnetic signal causing the disturbance arrives at the various detectors, taking as a reference one of the detectors, for example the detector D1.

The following time differences can therefore be determined for the event concerned:
- dt21 for detector D2 relative to detector D1.
- dt31 for detector D3 relative to detector D1,
- dt41 for detector D4 relative to detector D1.

The time differences used are naturally in the form of algebraic values and can be positive or negative depending on whether the signal arrives at a detector before or after at its arrival at the detector D1.

The triplet of values [dt21, dt31, dt41] can then be compared to each of the equivalent triplets established in this example in the reference database 22, i.e. all the triplets [dt21p, dt31p, dt41p], p varying from 1 to M, the number of origins of the meshing 12, so as to identify the origins whose triplets are the closest to the triplet of the event.

The distance between two triplets is for example calculated as the mean quadratic difference between the values of dt, i.e. relative to the origin Op, apart from a constant:

$$[(dt21-dt21p)2+(dt31-dt31p)2+(dt41-dt41p)2]{-2}$$

These differences calculated for the origins Op enable determination of a subset of origins for which the differences vary consistently relative to a barycenter of the origins to which the difference tends toward zero. It is therefore possible to eliminate singular origins having a low difference but not necessarily consistent with the differences of the neighboring origins.

It is of course possible to employ a known algorithm of any other type to calculate distances between sets of variables.

In a third mapping substep 256 the coordinates of the origins forming the subset identified in the preceding step are processed to define a zone on the exterior surface 11 of the aircraft substantially corresponding to a zone 14 grouping the determined locations of the origins of the subset or their interpretation, locations retained in the database 22 for each origin, zone which is considered as the zone in which the event 25 is assumed to have occurred.

This zone 14 is then presented 256 to an operator, advantageously in graphical or alphanumeric form, on a screen or in a listing.

The operator is then in a position to carry out detailed investigations in accordance with their usual professional practice, to the extent required and using measuring instruments over a limited zone of the aircraft.

The analysis step 250 can advantageously be applied to each event identified in a recording before carrying out investigations on the aircraft.

In fact the atmospheric conditions associated with the accumulation of electrostatic charges potentially leading to electrostatic discharges have a high probability of triggering a plurality of discharges during a flight. The recorded events can therefore make it possible to detect different zones giving rise to an electrical continuity problem and/or a plurality of discharges may be observed leading to the same zone on the surface of the aircraft, thus confirming the authentication of a fault in that zone.

In practice, depending on the density of the meshing 12 of the origins Op and the sampling frequency of the signals received by the detectors Di, the theoretical solution of the method can be relatively accurate and lead to relatively small identified zones 14. However, taking into account numerous unnecessary parameters can lead to uncertainties as to the calculated values and the recorded values, and it is not necessarily useful to circumscribe zones 14 of too small a size that could lead the operator to limit their investigations and to pass by the real cause of the electrostatic discharges they are looking for.

On the structure of a civil airliner, a zone 14 of the order of one square meter emerges as a good compromise between the benefit of limiting the investigation zone and that of not unduly restricting that zone.

The disclosed embodiment also concerns a system for executing the method that has just been described.

As the description of the method shows, the latter includes three principal steps each of which is carried out by appropriate means to execute them successively.

To this end the assembly therefore includes three complementary systems adapted to execute successively the preliminary step 210, the recording step 230 and the analysis step 250.

A first system, the purpose of which is to construct the reference database 22, is used to carry out the preliminary characterization step 210.

The first system mainly includes digital calculation means, nowadays conventional, programmed to determine by calculation for a given point on a structure 11 of a known aircraft the characteristics of an electromagnetic signal having its origin at other point of said structure.

To this end the calculation means include a memory for a digital model 21 of the structure 11, or at least for parts of the structure liable to influence significantly the propagation of the electromagnetic signals concerned.

This digital model 21 also includes the positions on said structure of the electromagnetic wave detectors Di.

In the first system, the digital model of the structure in the memory corresponds to that of an aircraft type to which the method is to be applied.

The calculation means also include an instructions memory and an arithmetic and logic unit, advantageously one or more processors, for carrying out the calculations and organizing the data.

First a meshing 12 of the structure of the aircraft 10 is produced.

If electrostatic discharges close to an exterior surface of the aircraft are considered, as is generally the case for electrostatic discharges resulting from the accumulation of electrical charges because of the effect of aerodynamic friction, the meshing 12 is primarily a meshing of said exterior surface.

The meshing 12 is advantageously carried out using any of numerous existing meshing software products, for example the HyperMesh software from the company Altair, with parameters set to address the requirements of the method, in particular in terms of resolution.

The first system is also configured with software for simulating the propagation of the electromagnetic waves in order to calculate at a point of the structure 11 the characteristics of a wave resulting from an electromagnetic wave emitted at some other point of the structure.

For this the programming of the instructions memory uses a simulation based on the laws of propagation of radio waves established by the Maxwell equations and applied to the environment formed by the structure of the aircraft.

The program is executed for each of the points of the meshing 12 considered as sources Op of the electromagnetic wave in order to determine characteristics of a signal 13 corresponding to the electromagnetic wave arriving at each of the detectors Di following the emission at the level of a source Op of a reference electromagnetic wave, the spectrum of which is advantageously representative of that resulting from an average electrostatic discharge.

Under the conditions considered here, an electrostatic discharge emits a wave the frequencies of which are mainly between 10 kHz and 1 GHz inclusive.

For each point of the meshing, the characteristics calculated for each of the detectors Di, in particular the propagation times of the electromagnetic wave and the associated wave profiles, are memorized in the reference database 22.

The first system for constructing the reference database 22, not shown in the drawings, has a conventional simulation calculation center architecture the application of which is here specific to the creation of the reference database 22.

A second system 50 employed for the recording step 230 and by which recordings 24 are produced during flights of said aircraft is on board the aircraft 10, as shown in FIG. 6a.

This second system is not functionally connected to the first system, but is associated with it in that the digital model 21 of the structure used is that of the aircraft type on which said second system is carried and the detectors are placed in the digital model at the locations of the detectors on said aircraft.

The second system 50 mainly includes detectors Di (i=1 to N) distributed across the structure of the aircraft, means 51 for recording signals received by said detectors, and media 53 for transmitting the signals received by each detector Di to said recording means.

Figure 6B:
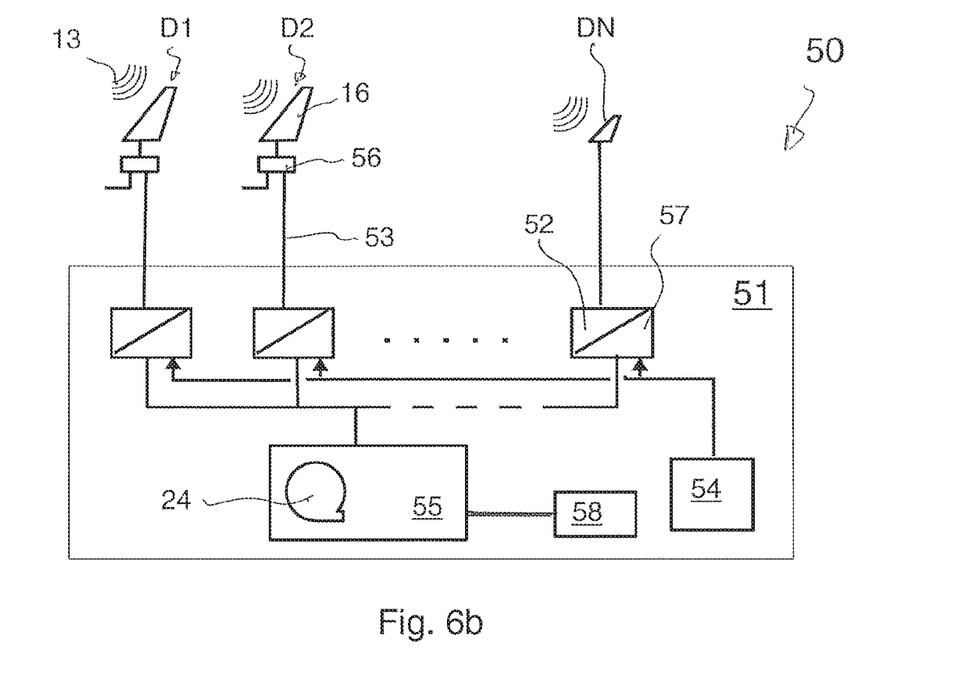
FIG. 6b shows a block diagram of a recording system shown without the aircraft.

In the aspect shown in FIG. 6a and in the detail shown in FIG. 6b, the detectors do not process the received signals, at most applying filtering to extract a wanted component from the signals reaching said detectors.

The signals received are transmitted by the transmission medium 53, for example a coaxial cable connection appropriate for the frequencies concerned.

Each transmission medium ends at a sampler 52 that samples the signals received by the recording means 51 of each of the detectors Di.

The recording means also include a timebase 54 that communicates an absolute time to synchronization means 57 for synchronizing the samplers and assigning a time-stamp at which the sampled signals reach the corresponding detector.

The recording means also include a recorder 55 in which the signals received by each detector and then sampled are recorded with the time-stamp data established by the timebase.

To establish the time-stamp at which a signal reaches each detector Di, the synchronization means 57 correct the time-stamp at which the signal reached said recording means by a propagation time of the signal between said detector and said recording means. The value of the correction applied to a time-stamp depends on the time the signal takes to cover the signal transmission path and can be established by any means such as calculation or an initial measurement.

It should be noted that the correction can be applied by analog means or preferably directly by calculation in a digital processing subsystem.

It should be noted that the accuracy of the time-stamp associated with a signal in the recording means 51 depends on the accuracy with which the signal is seen by said recording means. This accuracy depends in practice on the sampling frequency of the signal that is received by the recording means.

The higher the sampling frequency, the greater the accuracy of the time-stamp, at least in theory.

In practice the sampling frequency is chosen to be consistent with the required accuracy to avoid oversampling which would have the effect of increasing the size of the recordings with no practical benefit for accuracy.

In the case of the present device, sampling with a period of 0.5 to 3 nanoseconds is appropriate. For example a sampling period of 3 nanoseconds (330 MHz) enables relatively reliable identification of the start of a received electromagnetic pulse given the sampling period and an accuracy of the order of one meter to be achieved for the estimated difference between the location of an electrostatic discharge and a detector.

In a preferred aspect, the data is stored in a non-volatile memory of the recording means 55.

The recording device 51 also includes means for transmitting the recorded data for processing.

For example the recording device 51 can include a removable memory medium or, as in the example shown in FIG. 6b, digital connection means 58 adapted to transmit the recorded data, for example via a connector for downloading the content of the recording, and/or via near-field radio or optical transmission means for transmitting the content of the recording, and/or via a digital bus connected to a communication system of the aircraft such as a "datalink" system or a "gatelink" system. In the various solutions for transferring the content of the memory by downloading, the connections provided are preferably bidirectional connections to control remote downloading and to reinitialize the recording means.

These transfer solutions are merely examples, it being possible to use any transfer means appropriate to the environment and the flow of data.

Figure 7:
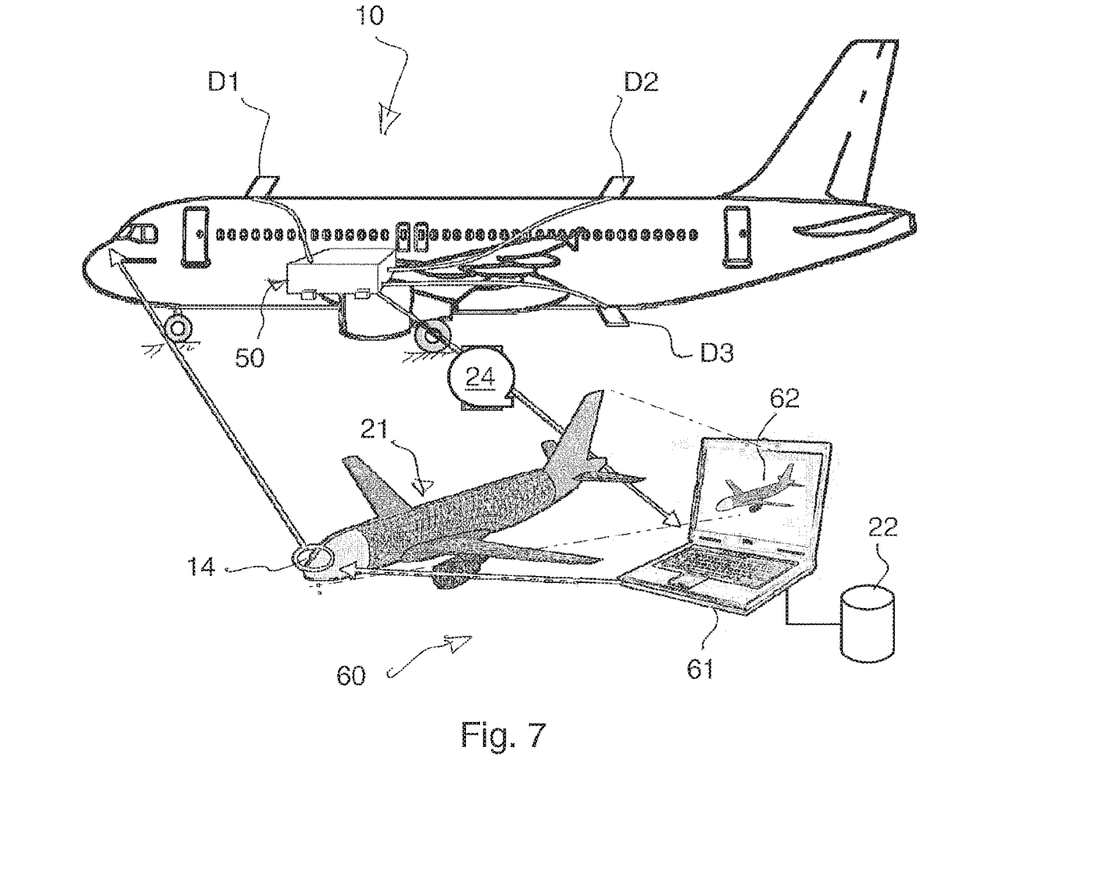
FIG. 7 shows a diagram of the system for analyzing the recorded signals by which the zone of the aircraft in which the electrostatic discharge occurred is identified.

The third analysis system 60, shown diagrammatically in FIG. 7, consists mainly in digital calculation means 61 configured to carry out the step 250 of analysis of the data recorded by the second system 50 in flight.

For this the third system 60 includes a local memory into which the recordings 24 are loaded, means for accessing the database 22, or a local copy of that database created beforehand by the first system, and means for accessing the digital model of the structure of the aircraft, or a local copy of that digital model, at least where the geometry of the exterior surface of the aircraft is concerned.

The calculation means of the third system 60, which have a conventional architecture, are configured by the use of software for:

1. Comparing the recordings of the signals received at the various detectors Di so as to identify the sequences corresponding, at least with a probability above a chosen threshold value, to the same event 25 received by each of the detectors or a predetermined subset of detectors. A subset of this kind is then taken into account for the search for the location of an event in a part of the structure of the aircraft.

This kind of identification is obtained by correlation of the shapes of the recorded signals coming from the various detectors and/or time-stamped in a time window compatible with the distances separating the various detectors.

It must be noted that the shape of a signal emitted by an electrostatic discharge can be very different from one discharge to another, because of the structure and the local conditions impacting the shape of the electromagnetic signal emitted, in particular a potential difference at the moment of the discharge. Statistically speaking, the signal from each electrostatic discharge is specific and a signature specific to the discharge concerned is liable to appear in the signals received at each detector.

2. Establishing for each identified event a set of characteristics equivalent to the characteristics in the reference database 22 associated with each of the origins Op, in particular arrival time differences at the various detectors Di of the signals emitted by the same event.

3. Comparing said set of characteristics of the event to each of the sets of corresponding characteristics of the origins Op of the reference database 22 and calculating for each of said origins Op a distance between the set of characteristics of the event and the set of characteristics of the origin Op concerned. The term distance is to be understood here as not meaning a geometrical distance but rather a distance separating two points in a space of dimension k, where k is a dimension of a vector corresponding to all of the characteristics attributed to an event.

4. Identifying a subset of origins 23 the calculated distances of which are minimal.

5. Defining, by the known location in the reference database 22 including the position of each of the origins Op, the position on a surface of the structure of the zone 14 of the location corresponding to the subset of origins 23 and in which is probably located the electrostatic discharge corresponding to the event being examined, and showing said probable location on a screen 62 or in a listing or by any other appropriate means of the calculation means 61, advantageously in a graphical manner, combined or not with another form of presentation, on a representation of the structure of the aircraft.

It is clear from the description of the method and from the example of a device in accordance with the disclosed embodiment for executing the method that said method and said device lend themselves to variants without departing from the presently disclosed embodiment.

In particular, the person skilled in the art could choose from various models and associated equations that may be considered and different solution algorithms that can be employed to describe the physical phenomena in play in the disclosed embodiment.

Depending on acquired experience and the type of aircraft concerned, the person skilled in the art will advantageously adapt the number of points of the meshing of the structure and the resulting density to suit the surface of the structure of the aircraft, in particular to address an accuracy of the location of the events.

They could equally adapt the signal sampling period.

The physical distribution of the functions can also be different from the distribution in the aspect shown in the FIG. 6b diagram.

For example the sampler 52 can be combined with the associated detector and transmit the digitized signals to the recording means 51.

The time-stamp corrections to take account of the length of the transmission media 53 can also be effected in different ways, in accordance with methods known in the field of signal synchronization.

The subset of origins 23 includes three points of the meshing, for example.

It can nevertheless include only one point in the case of a single point identified with a difference below a given threshold between the time differences established by the measurement on the event concerned and the time differences established by simulation for each of said points of the meshing. In this case the point retained can be associated with a chosen perimeter of uncertainty to delimit an investigation zone.

The subset can also include a greater number of points delimiting a zone on the surface of the structure of the aircraft, if necessary by determining in said zone the zones that are more or less concentric corresponding to different probabilities of location of the electrostatic discharge.

In one aspect of the method, the preliminary step 210 of characterization is avoided by using the same algorithms for direct calculation of the propagation of the radio signals emitted in accordance with a progressive method in which, starting from a possible origin of the electrostatic discharge, established for example by the arrival time differences of the signals at the sensors or a trilateration method, and the differences between the recorded signals and those calculated from the possible source, there is identified a new origin closer to the electrostatic discharge, the process being repeated to converge toward the most probable location of the electrostatic discharge.

In another aspect, independently of or in addition to the direct calculation methods, methods of calculating the inverse electromagnetic wave propagation are applied to the data from the recordings in order to work back from the detectors to the source of the signals observed.

This kind of processing employs algorithms conventionally employed in the field of radar, communication networks or goniometry, for example the Fourier or Prony or Capton algorithms as applied to sub-space methods (e.g. MUSIC or ESPRIT) or so-called LSE (Least Square Error) methods.

A model of the structure of the aircraft is then used, but there is no necessity to carry out the first step of the method.

As is clear from the description of the method, there is no requirement for real time processing of the recordings.

In fact although the recordings must necessarily be made during the flight, which implies that the second system 50 is onboard the aircraft, the exploitation of said recordings is of use only for determining on the aircraft investigations and any corrective operations that can be conducted and applied only with the aircraft immobilized on the ground.

Because of this, although the third analysis system 60 can be associated on the aircraft with the second recording system 50, and in this case deliver directly the location of the electrostatic discharge zones on the structure, said third system is advantageously installed on the ground, for example in a maintenance center, for processing the recordings before they are used.

This latter option on the one hand avoids the aircraft carrying a device that is of no utility for the flight crew and on the other hand enables the maintenance operator to follow the progress of the analysis and where necessary to intervene therein to resolve ambiguities or to interpret the results of the analysis interactively.

In this regard it may be pointed out that it is not necessarily a requirement to identify all the events that occur during a flight. It is probable that a zone where there is an electrical continuity fault of the structure of the aircraft will be the cause of a number of electrostatic discharges. By viewing the recordings, and on the basis of their experience, the maintenance operator will advantageously know how to select the most characteristic ones and those least affected by noise, which will be likely to provide a reliable location.

The third analysis system 60 uses data as a function of the structure of the aircraft for which the search for the location of electrostatic discharges must be carried out.

In one aspect, said third system includes an aircraft database in which the reference databases 22 corresponding to different aircraft designs are stored. In this case, the execution of the data processing step involves the selection beforehand of the aircraft design on which the recordings were made.

In one aspect of the second recording system 50, onboard the aircraft, the detectors can be dedicated detectors placed on the structure at chosen locations.

In this case, the number of detectors and their positions can be chosen to optimize the recording conditions and the conditions for determination of the electrostatic discharge zones.

However, this solution has the disadvantage of impacting on the definition of the structure through necessitating the provision of holes and the mounting of reinforcements and panels in order to install the detectors.

In another aspect of the second recording system 50 existing antennas on the aircraft 10 are used.

In fact, modern aircraft use radio, radio communications and radio navigation means that necessitate the arrangement of the antennas 16 on the structure of the aircraft. Because of their radio characteristics, various of these antennas are adapted to receive signals emitted by the electrostatic discharges.

In this aspect a coupler 56 is placed between an antenna 16 and the recording means 51, as shown in the case of the detectors D1 and D2 in FIG. 6b, so that a portion of the received signal can be transmitted to the recording means 51, the rest of the signal being transmitted to the equipment for which it is intended, for example a VHF radio.

As a result, it is not necessary to install dedicated detectors on the structure, or at the least a limited number of dedicated detectors is needed.

An antenna coupler 56 is installed in the vicinity of the antenna 16, for example. An antenna coupler 56 can also be installed in the vicinity of the equipment using the antenna, which is an advantageous solution if said equipment and the recording means 51 are installed near each other in the aircraft, for example in an avionics rack.

In this regard it may be pointed out that if the radio antennas 16 of the aircraft 10 are all in a plane of symmetry of said aircraft, an arrangement which is found on numerous aircraft, the exploitation of the recorded signals for these antennas alone used as detectors Di will lead to the definition of two probable zones for an electrostatic discharge placed symmetrically on the aircraft.

In this case it may be advantageous to install at least one detector in addition to the antennas in order to identify on which side of the plane of symmetry of the aircraft the electrostatic discharge occurred.

For satisfactory operation of the system it is advantageous to employ at least three detectors in the second system 50, a number greater than the number N of detectors advantageously being considered depending on the required accuracy of location of electrostatic discharges and the characteristics of the aircraft.

Thus the disclosed embodiment makes it possible to identify, if not an exact location on an aircraft structure where an electrostatic discharge actually occurred in flight, at least a reduced zone of the exterior surface of the aircraft in which the electrostatic discharge occurred.

A maintenance operator is then given the possibility of intervening in a small zone, for example one with an area of the order of 1 m$^2$, whereas the area of the exterior surface of an aircraft is generally several hundred square meters.

This small surface enables much faster intervention in the search for the exact causes of the electrostatic discharge or discharges and consequently makes it possible to deduce the corrective measures that can be applied.

This results in a much shorter immobilization of the aircraft and more effective measures taken because the exact causes are identified faster and better.

What is claimed is:

1. A method of locating electrostatic discharges that have occurred on an aircraft in flight, comprising:
    a step prior to the flight of the aircraft of creating a reference database in which reference database characteristics of electromagnetic signals to be received by each of a plurality of detectors arranged at various predefined locations on an exterior surface of said aircraft are defined for each of a plurality of points of a meshing of the exterior surface of the aircraft considered as an emission source of an electromagnetic wave;
    a step during the flight of the aircraft of recording the electromagnetic signals stemming from said electrostatic discharges and received by the plurality of detectors arranged at the various predefined locations on the exterior surface of said aircraft;
    a step of analyzing the signals recorded during the flight, in which analysis step characteristics of each of the signals received by the various detectors and corresponding to the same electrostatic discharge are processed to identify at least one zone of the exterior surface of the aircraft determining a structure part in which the electrostatic discharge probably occurred;

wherein the analysis step comprises a substep of grouping the recordings from the detectors event by event, an event corresponding to an electrostatic discharge during the flight of the aircraft, and wherein the analysis step compares data from the recordings corresponding to the same event with data simulated by direct electromagnetic wave propagation algorithms applied to electromagnetic emission sources at chosen locations on the structure of the aircraft in order to determine by a process of comparison the zone on the exterior surface of the aircraft where the electrostatic discharge from which said electromagnetic signals stem probably occurred.

2. The method as claimed in claim 1 wherein the recording step comprises a step of sampling the signals received by each detector and time-stamping said signals relative to a timebase common to all of the detectors.

3. The method as claimed in claim 2 wherein the sampled and time-stamped signals are recorded in a permanent memory of a recording system onboard the aircraft.

4. The method as claimed in claim 1 wherein the analysis step applies to the recordings from the detectors corresponding to the same event inverse electromagnetic wave propagation algorithms to determine the zone on the exterior surface of the aircraft where the electrostatic discharge from which said electromagnetic waves stem probably occurred.

5. The method as claimed in claim 1 wherein the characteristics of the recordings from the detectors corresponding to the same event are compared to the measured or calculated effects of an electromagnetic wave emitted by each of the points of a meshing of the exterior surface of the structure of the aircraft and in which the zone is defined by a subset of the points of the meshing with characteristics closest to the characteristics of the measured signal.

6. The method as claimed in claim 1 comprising a step of identification in graphical or digital form of the zone on the exterior surface of the aircraft.

7. The method as claimed in claim 1 wherein the position of each origin point of the meshing is identified in the database in a digital form.

8. The method as claimed in claim 1 wherein the shape of the electromagnetic signal simulated at the origin point is normalized in terms of its intensity and profile and is identical for all of the origin points.

9. An assembly for locating on a structure of an aircraft at least one electrostatic discharge occurring in flight, said assembly comprising:

a first system for construction of a reference database, said first system comprising a digital model of the structure of the aircraft on an exterior surface of which aircraft is defined a meshing determining arbitrary origin points of electromagnetic waves, said first system further comprising a simulator incorporating electromagnetic wave propagation algorithms, the reference database comprising, for each origin point defined by the meshing, at least one item of information on the position of said origin point on the exterior surface of the structure of the aircraft and calculated characteristics of time or of a shape of each of the signals to be received by a plurality of detectors located at predefined locations on the exterior surface of the structure of the aircraft following a simulated emission of an electromagnetic wave at the location of said origin point;

at least one recording system onboard the aircraft, said recording system comprising:

a plurality of detectors intended to be arranged at different predefined locations on the exterior surface of the structure of the aircraft;

means for sampling electromagnetic signals received by each detector of the plurality of detectors;

means for time-stamping said electromagnetic signals received; and means for permanently storing the sampled and time-stamped signals received by each of the detectors;

at least one analysis system comprising means for processing the signals recorded by the recording system, in which processing means:

the signals coming from the various detectors are compared with one another to identify in said recorded signals at least one event corresponding to an electrostatic discharge; and one or more electromagnetic wave propagation digital models are used to determine a zone of the exterior surface of the structure of the aircraft in which said electrostatic discharge that has been identified probably occurred.

10. The assembly as claimed in claim 9 wherein the recording system comprises hardware or software means for synchronization of the time-stamps allocated to the signals received by the detectors, said synchronization means compensating differences of transmission time of the signals between the detectors and the recording means.

11. The assembly as claimed in claim 9 wherein at least one detector employs a radio antenna of the aircraft to which is added an antenna coupler connected on the one hand to an antenna cable intended for an equipment of the aircraft, for which said antenna is installed, and on the other hand to a transmission medium connected to the recording means.

12. The assembly as claimed in claim 9, wherein the recording system comprises digital connection means for transfer of data with an installation on the ground to transfer the data recorded by said recording system to the analysis system.

13. The assembly as claimed in claim 9 wherein the signal processing means of the analysis system comprises a simulator incorporating electromagnetic wave inverse propagation algorithms and apply said inverse propagation algorithms to the signals received by the detectors and corresponding to the same event to locate a zone on the exterior surface of the structure of the aircraft from which stem said signals emitted by an electrostatic discharge.

14. The assembly as claimed in claim 9 wherein the signal processing means comprises the simulator incorporating direct electromagnetic wave propagation algorithms and applies said algorithms to determine, by comparison of the recorded data corresponding to the signals received by the detectors and corresponding to the same event with similar simulated data, a zone on the exterior surface of the structure of the aircraft from which stem the signals emitted by an electrostatic discharge.

15. The assembly as claimed in claim 9 further comprising an aircraft in which is installed the system for recording electromagnetic signals emitted by electrostatic discharges on said aircraft.

16. The assembly as claimed in claim 9, wherein radio receive antennas and/or radio navigation antennas of the aircraft are also used as the detectors of the recording system.

17. The assembly as claimed in claim 9 wherein the first system is configured with software for simulating the propagation of the electromagnetic waves.

18. The assembly as claimed in claim 9 wherein for each point of the meshing, the characteristics calculated for each of the detectors, including the propagation times of the electromagnetic wave and the associated wave profiles, are memorized in the reference database.

\* \* \* \* \*